United States Patent [19]
Gaind

[11] 3,941,928
[45] Mar. 2, 1976

[54] CORONA-FREE HIGH VOLTAGE CONNECTOR

[75] Inventor: Jagjit R. Gaind, Forest Park, Ill.

[73] Assignee: Zenith Radio Corporation, Chicago, Ill.

[22] Filed: Apr. 3, 1975

[21] Appl. No.: 564,937

[52] U.S. Cl. ........ 178/7.8; 174/50.54; 178/DIG. 11; 315/411; 339/201; 339/252 R; 357/79; 357/84
[51] Int. Cl.² H01L 23/48; H04N 5/64; H01R 11/04
[58] Field of Search .................... 178/7.8, DIG. 11; 174/50.54, DIG. 8, DIG. 11; 323/DIG. 1; 339/143 C, 201, 203, 252 R, 255 B; 357/77, 79, 80, 84; 315/411

[56] References Cited
UNITED STATES PATENTS

| | | | |
|---|---|---|---|
| 3,454,841 | 7/1969 | Urba | 357/84 |
| 3,716,661 | 2/1973 | Greeson | 178/7.8 |
| 3,875,438 | 4/1975 | Tharman | 357/79 |
| 3,885,198 | 5/1975 | Pritchard | 315/411 |

*Primary Examiner*—Howard W. Britton
*Attorney, Agent, or Firm*—Nicholas A. Camasto; Roy A. Ekstrand

[57] ABSTRACT

A pair of television receiver high voltage connectors, connecting the receiver high voltage rectifier to the cathode ray tube anode lead and the high voltage transformer, each include a resilient sleeve in which a cup-shaped contact and insulated wire together with an axially compressible spring are supported within a receptacle, formed by a portion of the sleeve inner surface and the cup-shaped connector. The receptacle expands to accommodate the insertion of the end portion of the high voltage rectifier forming an air-tight enclosure for the connection which is completed by the compression of the spring between the contact and rectifier.

5 Claims, 3 Drawing Figures

U.S. Patent  March 2, 1976  3,941,928
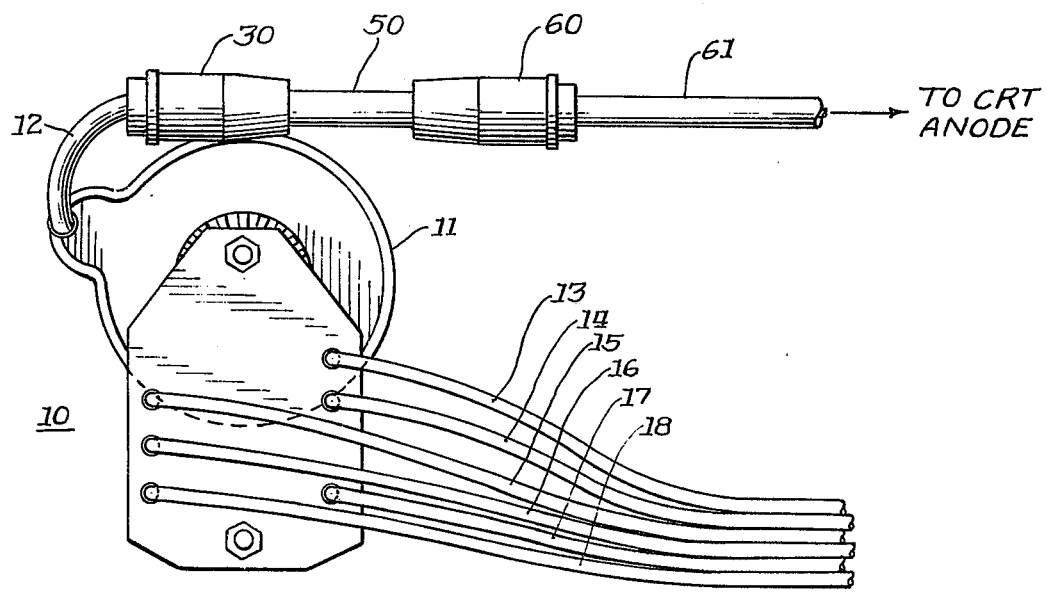
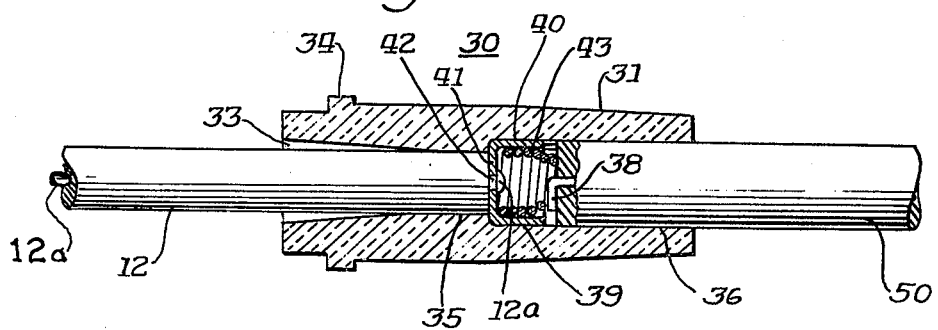
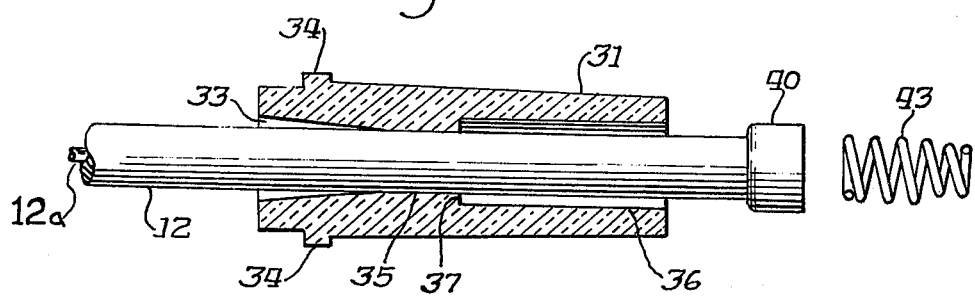

CORONA-FREE HIGH VOLTAGE CONNECTOR

BACKGROUND OF THE INVENTION

Television receivers utilize a high potential electron accelerating voltage for operation of cathode ray tube (CRT) display devices. In a typical receiver, a locally generated alternating polarity signal, associated with CRT horizontal scanning, is converted by a high voltage transformer to a high amplitude signal which, when applied to a high voltage rectifying device, produces a single polarity high voltage potential suitable for CRT operation.

Generally, the horizontal scanning signal generating components and the high voltage transformer are located on a separately manufactured receiver chassis or subchassis. The chassis, CRT and other components are combined within a cabinet during final assembly and appropriate connections made between the transformer, rectifying device and CRT. For a number of reasons, including ease of assembly and replacement of failed components, these interconnections may be made via connectors which are readily separable and capable of repeated use rather than being "permanently" welded or soldered.

Because the output of the high voltage transformer includes high amplitude, high frequency components, connections made thereto are susceptible to corona arcing which, in turn, can cause production of harmful ozone and deterioration of connector parts as well as interference with signal processing. Typically used high voltage connectors employ expensive insulating components and many require specially manufactured rectifiers.

For example, the high voltage rectifier may be encapsulated in a "header" or terminal suitable for mating with the type of high voltage connector employed, which substantially increases its cost over that of a rectifier with simple lead wire terminations.

OBJECTS OF THE INVENTION

Accordingly, it is an object of the present invention to provide an improved low cost high voltage connector suitable for a television receiver.

It is another object of the present invention to provide a low cost high voltage connector suitable to connect the high voltage transformer and CRT of a television receiver to a rectifying device having lead wire terminations.

SUMMARY OF THE INVENTION

An enclosed corona-free high voltage connector for use in a television receiver includes a resilient sleeve supporting a contact and spring within a receptacle. The sleeve expands to conform to the cylindrical rectifier body, completing an air-tight enclosure, with the spring being compressed to insure contact with the rectifier end lead. Separation forces cause elongation of the sleeve which constricts its diameter and tightens its grasp upon the rectifier. An additional retention mechanism is derived from the suction action of the air-tight enclosure.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 1 shows a portion of a television high voltage system constructed in accordance with the present invention;

FIG. 2 is a partially sectioned detail of the present invention connector before final assembly; and FIG. 3 is a partially sectioned detail of the present invention connector coupled to a high voltage rectifier.

DESCRIPTION OF THE PREFERRED EMBODIMENT

FIG. 1 shows a high voltage transformer, rectifier, and connector combination constructed in accordance with the present invention. A high voltage transformer 10, the details of which are omitted for clarity, is understood to be of conventional construction in which a plurality of windings (not shown) are disposed within a housing 11. A number of signal and operating voltage bearing wires 13–18 inclusive are connected to appropriate portions of the windings within housing 11. The transformer is part of a conventional reaction scan high voltage generating system in which locally generated signals are developed to provide scansion of a receiver cathode ray tube (CRT). A byproduct of the scansion process is a high amplitude energy pulse occurring during scan retrace. This pulse is applied to the high voltage transformer primary windings and "boosted" to an extremely high voltage pulse at the transformer output lead 12. A "stick type" rectifier 50 is connected to lead 12 by a first connector 30 and to a CRT anode lead 61 by a second, identical connector 60.

Rectifier 50 converts the alternating potential signal to a single polarity voltage suitable for application to a conventional CRT accelerating anode (not shown). Connectors are used on both ends of rectifier 50 to allow "in field" replacement of rectifier 50 should it fail.

FIG. 2 shows connector 30 before assembly. Transformer lead 12 extends beyond a resilient sleeve 31. A conductive cup 40 may be preassembled to a conductor 12a, and lead 12 passed through sleeve 31 before connection to the transformer or preferably lead 12 may be connected to the transformer, passed through sleeve 31 and cup 40 attached. Assembly of the connector is completed by pulling lead 12 to position cup 40 within sleeve 31. As cup 40 is pulled, sleeve 31 expands permitting movement of the cup until it abuts a shoulder 37 which provides positive cup positioning to assure accurate assembly. A flange 34 provides a convenient gripping surface during this pulling action facilitating assembly of the connector. A spring 43 having a base diameter selected to provide a "snap fit" in the interior of cup 40, completes the assembly.

FIG. 3 shows the assembled construction of connector 30 in detail with rectifier 50 inserted in the connector. Metal cup 40 is connected to conductor 12a of high voltage lead 12. Axially compressible spring 43 is positioned within the concave portion of cup 40 and supported therein. Sleeve 31 is formed of a suitable elastic insulating material such as polyvinyl chloride and supports cup 40 and lead 12 in contact with inner surfaces 35 and 39, forming an air-tight boundary. Another inner surface 36, together with cup 40, define a receptacle within sleeve 31 which accommodates one end of rectifier 50. Tapered surface 33 permits ready insertion of lead 12 into sleeve 31 during the preferred mode of assembly of the connector.

The illustrated position of the rectifier is attained by pushing one end of the rectifier into the receptacle formed by inner surface 36 and cup 40. This puts the sleeve in compression which expands the area defined by surface 36, providing ease of insertion. Once the rectifier is inserted, sleeve 31 relaxes and conforms to the body of the rectifier. Further, because of the friction fit between surfaces 35 and 36 and lead 12 and rectifier 50, respectively, forces tending to separate the parts are resisted since the sleeve is placed in tension. The elasticity of sleeve 31 provides a positive retention mechanism because these frictional forces cause an elongation of sleeve 31 and constriction of surface 36 tightening the grasp of the sleeve 31 on rectifier 50. Spring 43 is compressed between lead wire 38 of rectifier 50 and the lower portion of cup 40 to form an electrical connection therebetween. The spring constant of spring 43 is selected to be sufficient to maintain this sleeve tension and provide a tight positive retention.

Because surface 36 conforms to and grasps the body of rectifier 50 forming an air-tight enclosure around the electrical connection, corona arcing problems which might otherwise occur with an "open air" connection of the high amplitude, high frequency signal are alleviated. In addition, the air-tight enclosure provides a suction action for positively retaining rectifier 50 within sleeve 31.

It should be noted that rectifier 50 is an encapsulated structure having a simple external lead wire conductor 38. Because positive retention is attained by the action of sleeve 31 upon the body of rectifier 50 rather than upon its end termination, no special heading or termination of rectifier 50 is required. Instead, the normally packaged rectifier lead 38 is simply bent to the position shown and cut to appropriate length. This eliminates the expensive heading and terminating operations required in conventional high voltage connector schemes.

Rectifier 50 may be disconnected from lead 12 despite the positive lock retention mechanisms described above by an axial twisting movement during withdrawal. The twisting motion of rectifier 50 simultaneously breaks the contact of surface 36 and the integrity of the air-tight enclosure thereby permitting withdrawal of rectifier 50. The connector described is capable of repeated connection and disconnection and exhibits the desired "one way retention", namely, easy connection and positive retention.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. For use in the high voltage system of a television receiver in which a locally generated high amplitude alternating polarity signal is converted to a single polarity electron accelerating potential by a rectifying device having one end terminating in an electrical conductor, connecting means for producing a substantially air-tight, corona-free connection to said rectifying device comprising:
   wire means having a conductor and surrounding insulator;
   a contact mechanically and electrically connected to said conductor;
   a resilient sleeve, having first and second ends, retaining said contact intermediate said ends with said wire means extending from said second end of said sleeve, said contact and the inner surface of said sleeve between said contact and said first end, forming a receptacle; and
   an axially compressible spring, positioned in said receptacle, said resilient sleeve conforming to and grasping said one end of said rectifying device upon its insertion into said receptacle to compress said spring and electrically connect said one end of said rectifying device to said contact within said receptacle.

2. Connecting means as set forth in claim 1, wherein said contact comprises a metal cup having a flange extending toward said first end of said sleeve and means for retaining said spring in said cup.

3. Connecting means as set forth in claim 2, wherein said one end of said rectifying device and said receptacle are substantially cylindrical, the diameter of said receptacle being smaller than that of said one end of said rectifying device.

4. Connecting means as set forth in claim 3, wherein said axially compressible spring has a diameter slightly greater than the inner flange diameter of said cup permitting a snap fit into said cup during assembly.

5. In combination in a television receiver:
   a high voltage transformer including an insulated high voltage conductor;
   a cylindrical rectifier having wire end terminals;
   a cathode ray tube anode conductor;
   first connecting means connecting one end of said rectifier to said high voltage conductor;
   second connecting means connecting the other end of said rectifier to said cathode ray tube anode conductor, each said connecting means including:
   a resilient sleeve having a first end receiving one of said conductors and a second end receiving an end of said rectifier in a gripping relationship;
   a cup contact connected to said conductor and an axially compressible spring engaging said cup contact and the wire end terminal of said rectifier, said cup contact, said conductor and said rectifier cooperating with respective portions of the inner surface of said sleeve to form an air-tight, corona-resistant connection.

\* \* \* \* \*